United States Patent
Tamigniaux et al.

(10) Patent No.: US 12,154,820 B2
(45) Date of Patent: Nov. 26, 2024

(54) MAGNETIC STOPPER FOR A ROTARY MOTION SYSTEM

(71) Applicant: ETEL S.A., Môtiers (CH)

(72) Inventors: Philippe Tamigniaux, Morteau (FR); Yannick Droval, Neuchâtel (CH)

(73) Assignee: ETEL S.A., Môtiers (CH)

( * ) Notice: Subject to any disclaimer, the term of this patent is extended or adjusted under 35 U.S.C. 154(b) by 496 days.

(21) Appl. No.: 17/621,916

(22) PCT Filed: Jun. 18, 2020

(86) PCT No.: PCT/EP2020/066917
§ 371 (c)(1),
(2) Date: Dec. 22, 2021

(87) PCT Pub. No.: WO2021/004747
PCT Pub. Date: Jan. 14, 2021

(65) Prior Publication Data
US 2022/0254677 A1    Aug. 11, 2022

(30) Foreign Application Priority Data

Jul. 9, 2019 (EP) .................................. 19185245

(51) Int. Cl.
*H01L 21/687* (2006.01)
*B25J 9/10* (2006.01)
(Continued)

(52) U.S. Cl.
CPC ........ *H01L 21/68792* (2013.01); *B25J 9/101* (2013.01); *B25J 19/0091* (2013.01);
(Continued)

(58) Field of Classification Search
CPC ........ B25J 9/101; B25J 19/0091; B25J 19/06; F16H 2035/006; G05G 5/04; H01F 7/02;
(Continued)

(56) References Cited

U.S. PATENT DOCUMENTS

| 7,397,554 B1 | 7/2008 | Li et al. |
| 2003/0175136 A1 | 9/2003 | Hirata et al. |

(Continued)

FOREIGN PATENT DOCUMENTS

| CN | 1268927 A | 10/2000 |
| CN | 101460772 A | 6/2009 |

(Continued)

OTHER PUBLICATIONS

Machine translation of JP 2000-64694 A (Year: 2024).*

(Continued)

*Primary Examiner* — Richard M Lorence
(74) *Attorney, Agent, or Firm* — Carter, DeLuca & Farrell LLP (57) ABSTRACT

A magnetic stopper, for a rotary motion system that includes a base unit and a rotary unit rotatably mounted on the base unit, includes a static part configured to be mounted on the base unit and a rotary arm configured to be mounted on the rotary unit. The static part includes a rotary arm stopping portion configured to receive a distal end portion of the rotary arm, and a movable arrangement including a magnet holder and a mobile magnet mounted on the magnet holder and movable within the rotary arm stopping portion. The rotary arm includes a rotary arm magnet configured to magnetically interact with the mobile magnet when the static part and the rotary part are mounted respectively on the base and rotary units, to prevent excessive movement of the rotary unit when the rotary motion system is operating.

22 Claims, 4 Drawing Sheets

(51) Int. Cl.
  *B25J 19/00* (2006.01)
  *B25J 19/06* (2006.01)
  *F16H 35/00* (2006.01)
  *H01F 7/02* (2006.01)

(52) U.S. Cl.
  CPC ................ *B25J 19/06* (2013.01); *H01F 7/02* (2013.01); *F16H 2035/006* (2013.01)

(58) Field of Classification Search
  CPC ................ H01F 7/0221; H01F 7/0231; H01L 21/68792; Y10T 74/20305
  USPC ................................ 192/138, 139, 148, 149
  See application file for complete search history.

(56) References Cited

U.S. PATENT DOCUMENTS

| | | |
|---|---|---|
| 2005/0254932 A1 | 11/2005 | Kellerman et al. |
| 2008/0017256 A1 | 1/2008 | Thomas et al. |
| 2010/0278623 A1* | 11/2010 | Blank ...................... B25J 9/101 192/139 |
| 2016/0166367 A1 | 6/2016 | Kleppen |

FOREIGN PATENT DOCUMENTS

| | | |
|---|---|---|
| CN | 201690338 U | 12/2010 |
| CN | 201714201 U | 1/2011 |
| CN | 105340157 A | 2/2016 |
| CN | 206035166 U | 3/2017 |
| CN | 206358260 U | 7/2017 |
| EP | 0573160 A1 | 12/1993 |
| GB | 1521345 A | 8/1978 |
| JP | 2000064694 A | 2/2000 |
| JP | 2004-027664 A | 1/2004 |
| KR | 20100115854 A | 10/2010 |

OTHER PUBLICATIONS

Notice of Reasons for Refusal issued by the Japanese Patent Office on Mar. 14, 2024 in corresponding JP Patent Application No. 2022-500546, with English translation.
International Search Report issued in corresponding International Application No. PCT/EP2020/066917 dated Aug. 21, 2020, pp. 1-4.
Chinese Office Action issued in corresponding CN Patent Application No. 202080049748.4 dated Jan. 9, 2024, with English translation.

* cited by examiner

Fig. 1

*Prior art*

Fig. 2

*Prior art*

MAGNETIC STOPPER FOR A ROTARY MOTION SYSTEM

FIELD OF THE INVENTION

The present invention relates to a magnetic stopper for a rotary unit of a rotary motion system. The present invention also relates to a high-precision positioning system including a rotary motion system equipped with the magnetic stopper and mounted on an X-Y motion system.

BACKGROUND INFORMATION

Rotary motion systems, of the type of a wafer chuck rotatably mounted on a base unit, usually include vacuum tubing connected to the wafer chuck (hereafter referred as a rotary wafer holding unit) and to a vacuum source in order to hold a wafer in place by applying negative pressure to the backside of the wafer through vacuum holes or rings patterns arranged on the surface of the rotary wafer holding unit. The wafer holding unit cannot therefore withstand a continuous rotation movement, otherwise the vacuum tubing would be disconnected from the vacuum source and wrapped around the wafer chuck, thereby causing wear and tear to the tubing and possibly damages to the rotary motion system.

Generally, the rotary wafer holding unit is configured to be driven in rotation in both clockwise and anti-clockwise directions from a reference position. Various mechanical stoppers already exist to prevent a continuous rotation of the rotary wafer holding unit, thereby allowing a rotation of the holding unit slightly exceeding beyond 180° from the reference position when driven in a clockwise or anti-clockwise direction.

Figure 1:
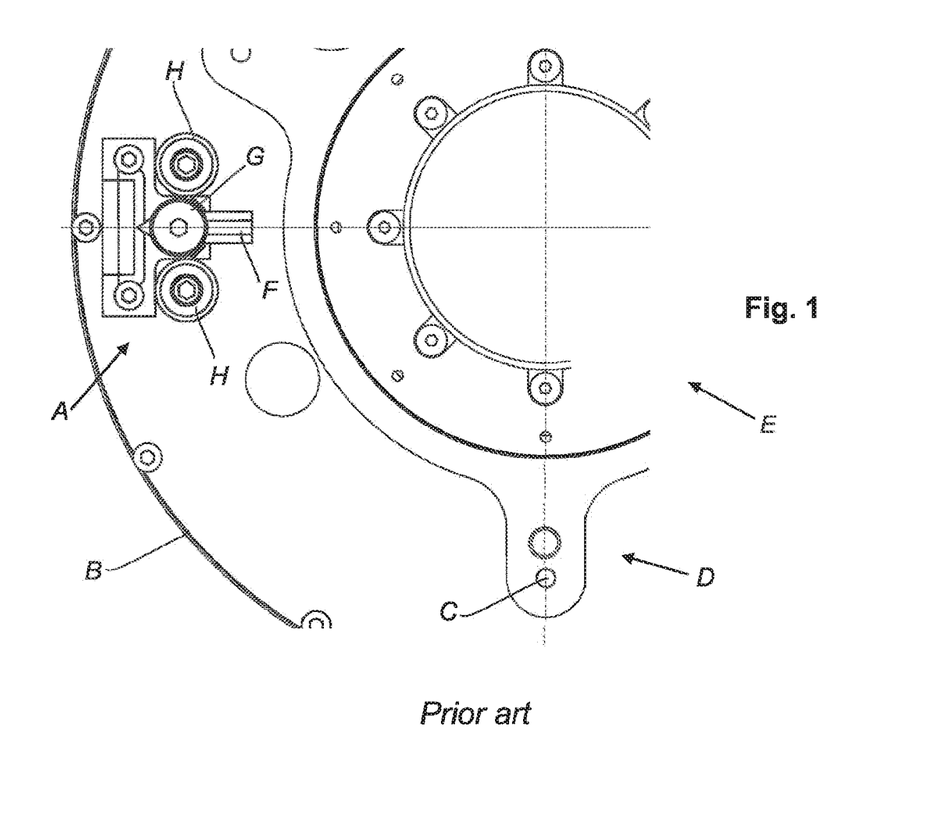
FIG. 1 is a top view of a wafer holding unit rotatably mounted on a base unit and including a conventional stopper.

FIG. 1 shows an example of a conventional mechanical stopper. The mechanical stopper includes a static part A mounted on a base station B of a rotary motion system while a pin C is mounted on and perpendicularly to a radially extending portion D forming an integral part with a rotary wafer holding unit E rotatably mounted on the base station B. The static part of the mechanical stopper includes a shock-absorber F connected to a pivot G and two hard-stops H arranged on both sides of the pivot. The pin C of the wafer holding unit E is configured to hit either side of the shock-absorber F depending on the rotation direction of the rotary wafer holding unit E. The impact between the pin C on either side of the shock-absorber F causes the latter to rotate around the pivot G to progressively bring the rotary wafer holding unit to a standstill.

In case the rotary wafer holding unit E goes into an error mode and exceeds a predefined rotation, the pin C of the holding unit hits the shock-absorber F, whereupon the shock-absorber rotates around the pivot G until it enters into contact with either hard-stop H in order to bring the rotary wafer holding unit to a standstill.

Mechanical shocks should however be avoided for precision position systems for cleanroom environment applications as these shocks could generate particles which may have a significant negative impact for both Front-End and Back-End applications for the manufacturing of semiconductor devices.

Figure 2:
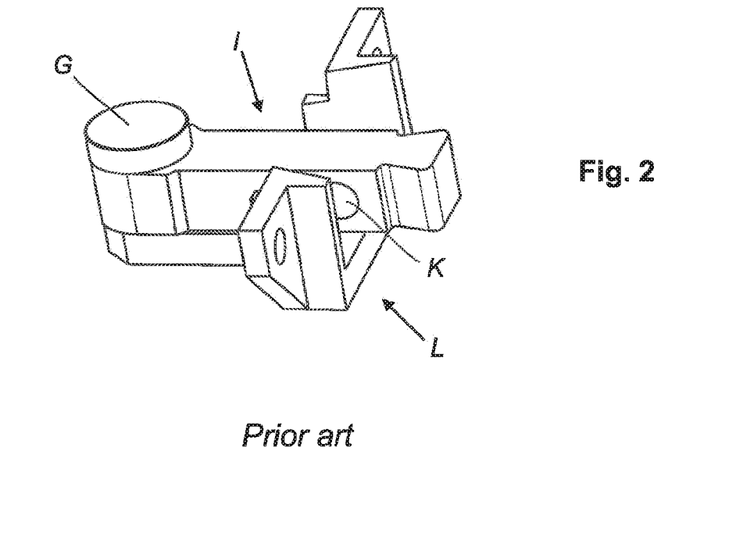
FIG. 2 is a perspective view of a conventional stopper.

FIG. 2 shows a conventional mechanical stopper which has been developed to prevent the shock-absorber of FIG. 1 to swing and bump against both hard-stops H when subjected to high accelerations. This is particularly the case when the rotary position system of the type shown in FIG. 1 is mounted on an X-Y motion system, prone to high accelerations, for high-precision positioning applications.

The stopper includes an arm I having a proximal portion pivotably mounted on a pivot G and a distal end portion arranged to be hit by the pin C of the rotary wafer holding unit E of FIG. 1. A magnet K is mounted in the arm I which is positioned inside a bracket L made of ferromagnetic material. Upon acceleration of the X-Y motion system, the magnet K is urged against either opposite side of the bracket L, thereby locking the arm by magnetic attraction force into a first or a second locking position depending on the direction of the accelerations. This mechanical stopper thus overcomes the problem of mechanical shocks with both hard-stops H when subjected to high accelerations.

Yet, even with the mechanical stopper of FIG. 2, particles may be generated not only by the impact between the pin C and the distal end portion of the arm I but also by friction occurring between the pivot G and the arm I when the latter is rotating.

SUMMARY

Example embodiments of the present invention provide a particle-free stopper, or at least a stopper which generates fewer particles, for rotary unit of rotary motion systems.

Example embodiments of the present invention provide a resilient and durable stopper for rotary unit of rotary motion systems.

Example embodiments of the present invention provide a high-precision positioning system compliant with stringent cleanroom classifications and standards.

According to an example embodiment of the present invention, a magnetic stopper for a rotary motion system includes a base unit and a rotary unit rotatably mounted on the base unit. The magnetic stopper includes a static part configured to be mounted on the base unit and a rotary arm configured to be mounted on the rotary unit. The static part includes a rotary arm stopping portion configured to receive a distal end portion of the rotary arm, and a movable arrangement including a magnet holder and a mobile magnet mounted on the magnet holder and movable within the rotary arm stopping portion. The rotary arm includes a rotary arm magnet configured to magnetically interact with the mobile magnet when the static part and the rotary part are mounted respectively on the base and rotary units in order to prevent excessive movement of the rotary unit when the rotary motion system is operating.

According to example embodiments, the magnet holder is shaped to hold the mobile magnet such that the magnet's poles N-S are aligned with a tangent of the circular trajectory of the rotary arm magnet when the rotary arm moves within the rotary arm stopping portion of the static part.

According to example embodiments, the mobile magnet and the rotary arm magnet are positioned such that the same pole of each magnet face each other when the rotary arm moves within the rotary arm stopping portion, thereby repulsing each other without any contact.

According to example embodiments, the circular trajectory of the rotary arm magnet within the rotary arm stopping portion extends between 10° and 20°, and, for example, between 10° and 15°.

According to example embodiments, the distal end portion of the rotary arm includes a magnet receiving portion in which the rotary arm magnet is mounted with its opposite poles N-S aligned with a tangent of the circular trajectory of the rotary arm magnet when the rotary unit is rotating relative to the base unit.

According to example embodiments, the movable arrangement further includes a blade including a proximal end portion connected to the static part and a distal end portion connected to the magnet holder. The blade is configured to bend when the rotary arm magnet is magnetically interacting with the mobile magnet.

According to example embodiments, the static part includes a casing. The blade is positioned inside the casing along an axis equidistant from the lateral sides of the casing when the blade is in a non-operating configuration.

According to example embodiments, the rotary arm stopping portion includes two inclined opposite sides with respect to the axis. The magnet holder comes into contact against either of the opposite sides in case the rotary unit goes into an error mode and exceeds a predefined rotation.

According to example embodiments, the static part of the magnetic stopper further includes static magnets mounted on the casing to prevent the magnet holder from coming into contact against either of two opposite sides of the rotary arm stopping portion in case the rotary unit goes into an error mode and exceeds a predefined rotation.

According to example embodiments, the mobile magnet has a cuboid shape while the rotary arm magnet has a cylindrical shape.

According to an example embodiment of the present invention, a rotary motion system includes a rotary unit rotatably mounted on a base unit. The rotary motion system further includes a magnetic stopper as described herein. The rotary arm of the magnetic stopper is mounted on the rotary unit while the static part of the magnetic stopper is mounted on the base unit.

According to example embodiments, the rotary arm is mounted on a lateral side portion of the rotary unit and extends radially outwardly from an outer edge of the lateral portion.

According to an example embodiment of the present invention, a high-precision positioning system includes an X-Y motion system and a rotary motion system as described herein mounted on the X-Y motion system.

Further features and aspects of example embodiments of the present invention are described in more detail below with reference to the appended schematic Figures.

DETAILED DESCRIPTION

Figures 3, 4, 5:
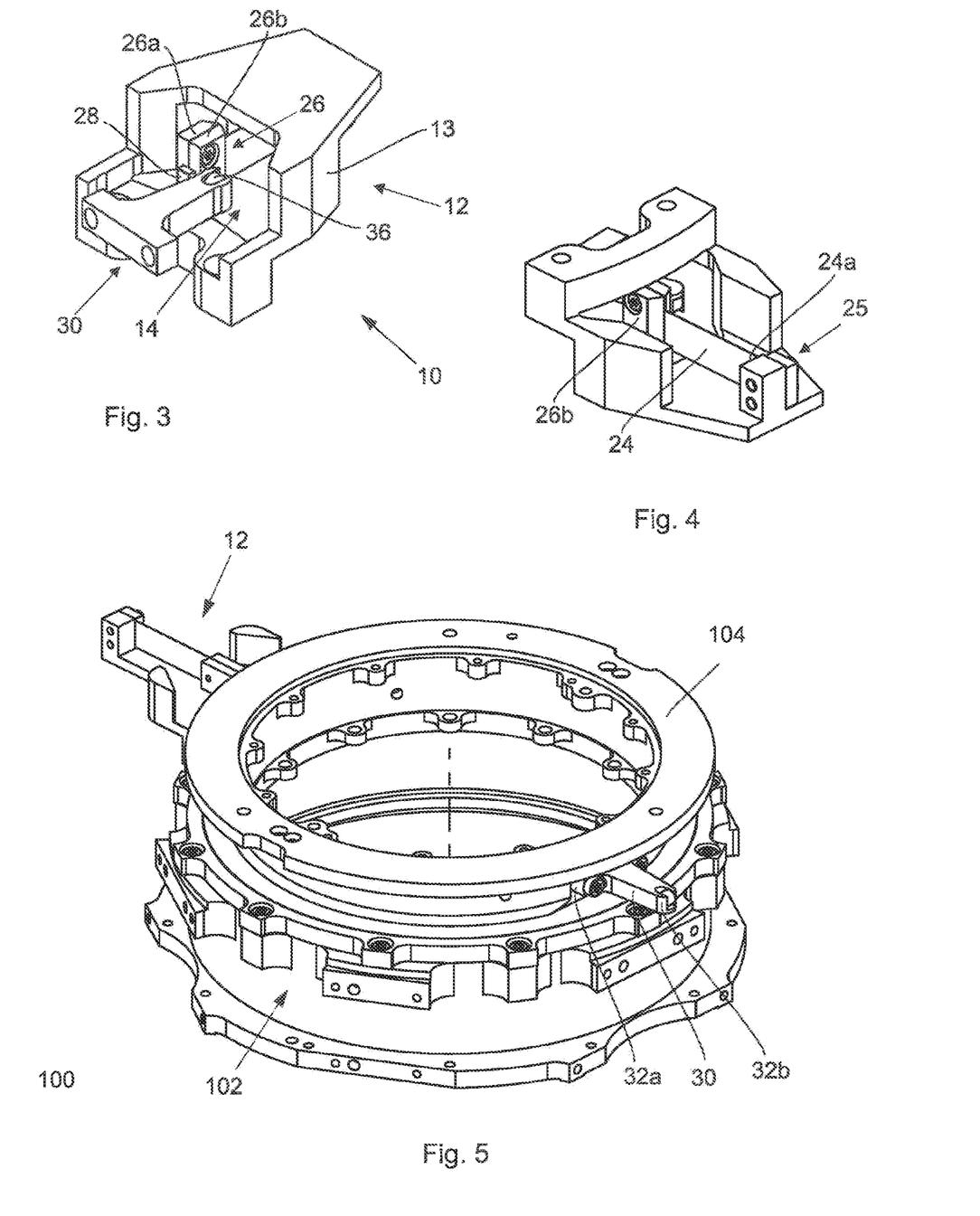
FIG. 3 is a perspective view of the magnetic stopper according to an example embodiment of the present invention.
FIG. 4 is a perspective view of the magnetic stopper illustrated in of FIG. 3.
FIG. 5 is a perspective view of a wafer holding unit rotatably mounted on a base unit and including the magnetic stopper illustrated in FIGS. 3 and 4.
Figure 6:
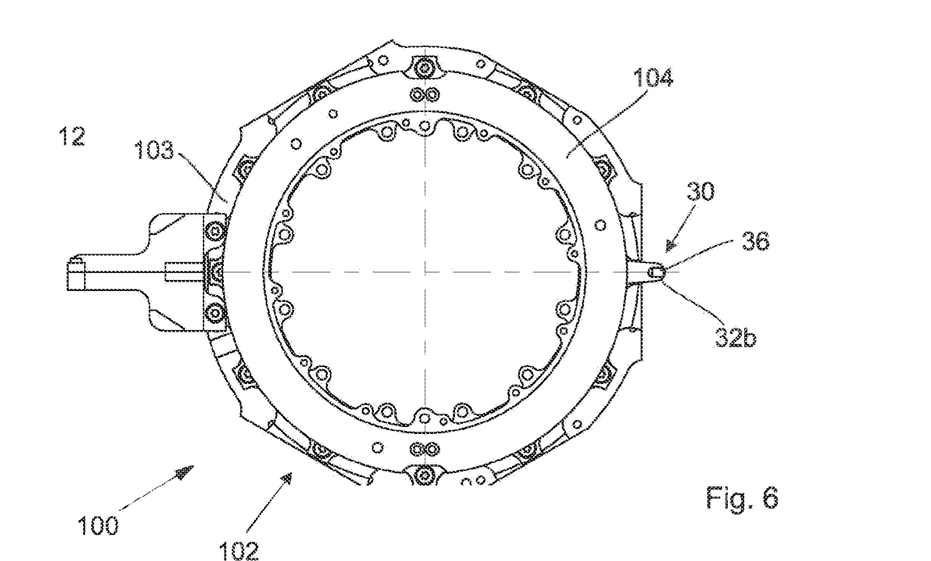
FIG. 6 is a top view of the wafer holding unit rotatably mounted in the base unit and including the magnetic stopper.

With reference to FIGS. 5 and 6, the rotary motion system 100 includes a base unit 102 and a rotary unit, for example, a rotary wafer holding unit 104, rotatably mounted on the base unit 102. The rotary unit is configured to be driven in rotation in both clockwise and anti-clockwise directions from a reference position, within a predefined range of ±182.5 degrees, for example.

The rotary motion system 100 may be mounted on an X-Y motion system to provide a high-precision positioning system. The high-precision positioning system is particularly well adapted for the semiconductor industry for Front-End and Back-End applications where precise alignment between a process or a control tool and a wafer or semiconductor chips is of the utmost importance.

In an example embodiment, the rotary motion system 100 includes a magnetic stopper which is not subjected, under operating conditions, to any friction, nor any impact. The magnetic stopper 10 includes a static part 12 mounted on the base unit 102 and a rotary arm 30 mounted on the rotary unit 104. As illustrated in FIG. 5, a proximal end portion 32a of the rotary arm 30 is fixedly mounted on the rotary unit 104, for example, inside a cavity arranged on a lateral side portion of the rotary unit 104. The rotary arm 30 extends radially and protrudes outwardly from the outer edge of the lateral side portion of the rotary unit 104 within a horizontal plane. The static part 12 of the magnetic stopper 10 is fixed on a mounting base portion 103 of the base unit 102 such that a distal end portion 32b of the rotary arm 30 may magnetically interact with a portion of the static part 12.

Figure 7:
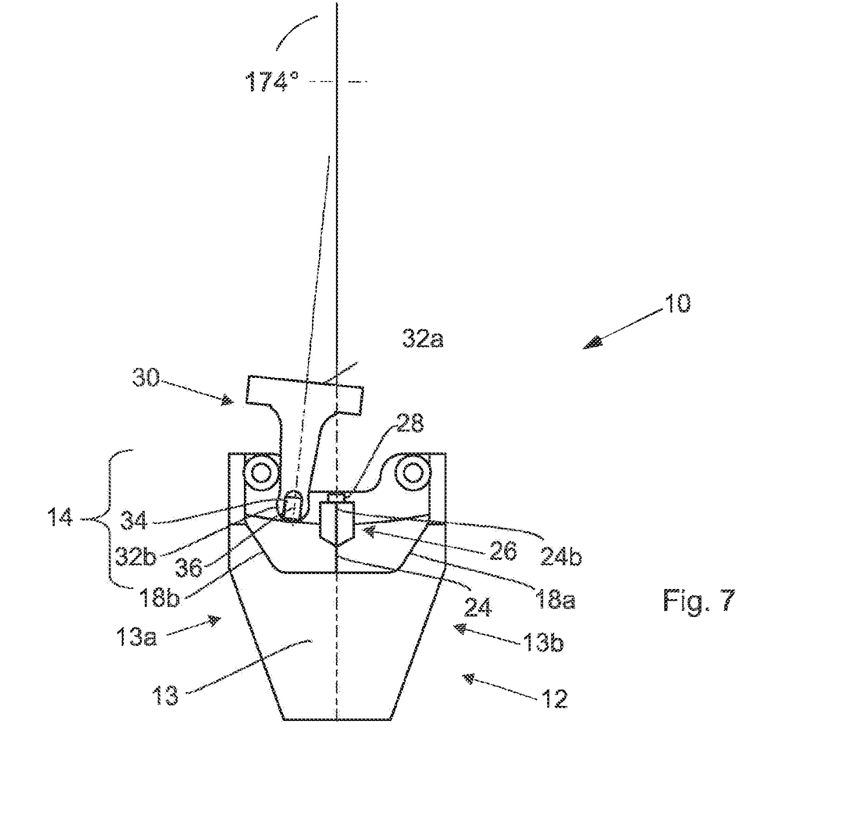
FIG. 7 is a top view of the magnetic stopper illustrated in FIGS. 3 and 4, in which the rotary arm is about to magnetically interact with the static part of the magnetic holder.

More particularly, the static part 12 of the magnetic stopper 10, as shown for example in FIGS. 3 and 4, includes a casing 13 inside which is mounted a blade 24. The blade 24 includes proximal end portion 24a connected to the casing 13, for example, by a clamping arrangement 25. A magnet holder 26 is connected to a distal end portion 24b of the blade 24 (see, e.g., FIG. 7). The magnet holder 26 includes a first magnet holder fixing part 26a arranged against one side of the distal end portion of the blade 24 and a second magnet holder fixing part 26b arranged against an opposite side of the distal end portion of the blade 24 and is connected to the first fixing part 26a, thereby squeezing the distal end portion 24b therebetween. The second magnet holder fixing part 26b may be, for example, screwed into the first magnet holder fixing part 26a as illustrated in FIGS. 3 and 4. As illustrated in FIG. 7, the blade 24 is positioned inside the casing 13 along an axis equidistant from the lateral sides 13a, 13b of the casing when the blade is in a non-operating configuration. The rotary arm stopping portion 14 includes two inclined opposite sides 18a, 18b with respect to the axis.

The distal end portion 32b of the rotary arm 30 includes a magnet receiving portion 34, for example, in the form of a cavity, inside which is mounted a polarized rotary arm magnet 36 having, for example, a cylindrical shape. The rotary arm magnet 36 is oriented in the magnet receiving portion 34 such that the opposite poles N-S of the magnet 36 are aligned with a tangent of the circular trajectory of the rotary arm magnet 36 when the rotary unit 104 is rotating relative to the base unit 102 of the rotary motion system 100.

The magnet holder 26 of the static part 12 is shaped to hold a mobile magnet 28, having, for example, a cuboid shape as illustrated in FIG. 3, such that the magnet's poles N-S are also aligned with a tangent of the circular trajectory of the rotary arm magnet 36 when the blade 24 is in a non-operating configuration as illustrated in FIG. 7. The mobile magnet 28 and the rotary arm magnet 36 are positioned such that the same pole of each magnet 28, 36 face each other when the rotary arm 36 of the rotary unit 104 engages a rotary arm stopping portion 14 of the magnetic stopper 10, thereby repulsing each other without any contact. The cuboid shape of the mobile magnet 28 and the cylindrical shape of the rotary arm magnet 36 take into consideration the relative position change between the magnets 28, 36 when the latter interact with each other.

FIG. 7 illustrates the magnetic stopper 10 which is about to pass from a non-operating to an operating configuration. The rotary holding unit 104 is driven in rotation such that the rotary arm magnet 36 has travelled along a circular arc of 174° from the reference position to engage the rotary arm stopping portion 14 without reaching a position close enough to magnetically interact with the mobile magnet 28.

Figures 8, 9:
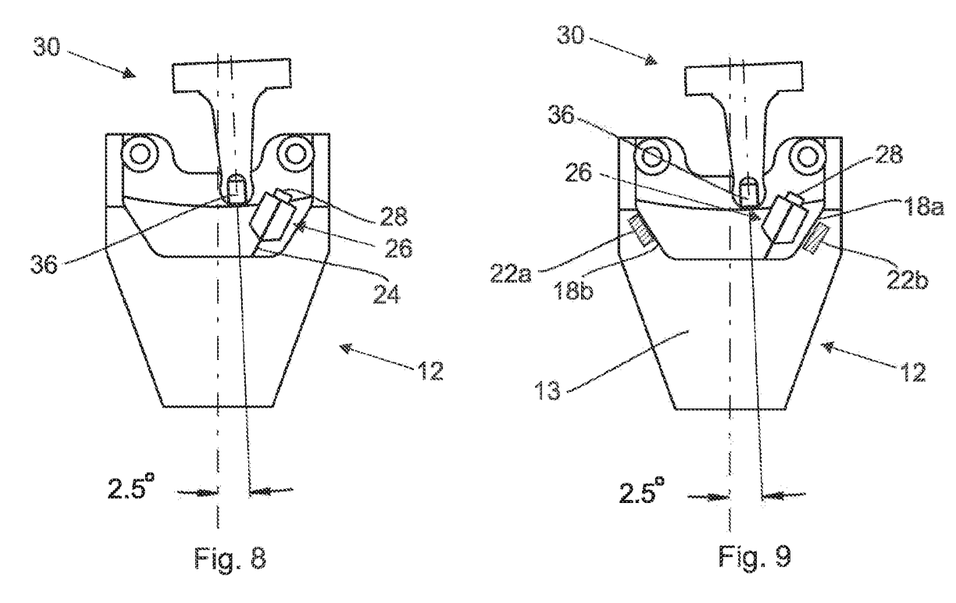
FIG. 8 is a similar view to that of FIG. 7, in which the rotary arm has reached a standstill position corresponding to a repulsion-equilibrium state between the rotary arm magnet and the mobile magnet.
FIG. 9 is a similar view to that of FIG. 8 illustrating another example embodiment.

Upon further rotation of the rotary holding unit 104, the rotary arm magnet 36 reaches a position, whereupon magnetic repulsion between the same poles of the mobile magnet 38 and the rotary arm magnet 36, for example, the North pole, begins to occur, thereby starting to bend the blade 24 until the magnetic interaction between both magnets 36, 38 reaches an repulsion-equilibrium state as illustrated, for example, in FIG. 8. The repulsion-equilibrium state is reached, in this exemplary embodiment, when the rotary holding unit 104 is driven in rotation such that the rotary arm magnet 36 has travelled along a circular arc of approximatively 182.5° from the reference position.

When the rotary holding unit 104 is driven in the opposite direction through its predefined range, i.e. 182.5°, the blade 24 returns into its non-operating configuration until the rotary arm magnet 36 engages the other sides of the rotary arm stopping portion 14, whereupon magnetic repulsion between the same poles of the mobile magnet 38 and the rotary arm magnet 36, i.e., the South pole in this exemplary embodiment, begins to occur, thereby starting to bend the blade 24 in the opposite direction until the magnetic interaction between both magnets 36, 38 reaches the repulsion-equilibrium state.

Figure 10:
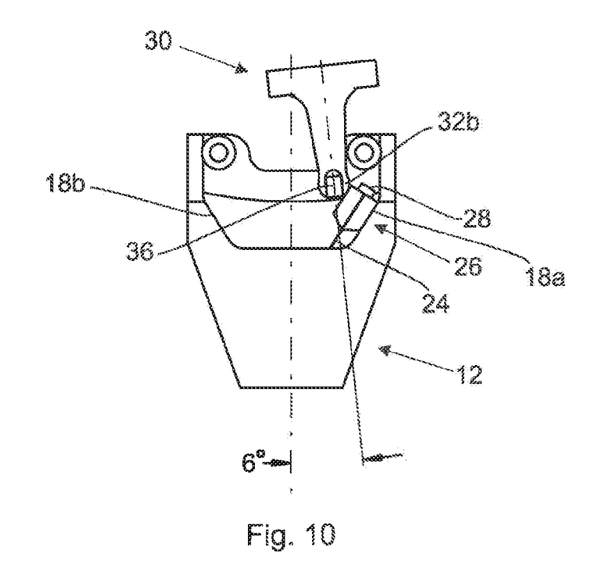
FIG. 10 is a similar view to that of FIG. 8, when the rotary unit exceeds a predefined rotation and goes into an error mode.

In case the rotary holding unit goes into an error mode and exceeds its predefined range of ±182.5 degrees as illustrated in FIG. 10, the distal end portion 32b of the rotary arm 30 comes into contact with the magnetic holder 26 which is brought against either inclined opposite side 18a, 18b of the rotary arm stopping portion. Both inclined opposite sides 18a, 18b can withstand the peak torque of the motor of the rotary motion system.

As illustrated in FIG. 9, the static part 12 of the magnetic stopper 10 includes two static magnets 22a, 22b mounted on the casing 13, e.g., near both inclined opposite sides 18a, 18b to prevent the magnet holder 26 from coming into contact against either opposite side 18a, 18b in case the rotary unit exceeds its predefined range such as any oscillation due to perturbations or accelerations of the rotary motion system is limited by a couple of repulsion forces: i) a repulsion force occurring between the mobile magnet 28 and the rotary arm magnet 36, and ii) a repulsion force between the mobile magnet 28 and either static magnet 22a, 22b.

The configuration of magnetic stopper as described above has the advantage not to produce any particles, when operating, as there is no impact, nor any friction occurring between the different parts of the magnetic stopper. The magnetic stopper is also more resilient and durable than conventional mechanical stoppers. This is primarily due to different factors, including: contrary to conventional stoppers with a pivoting part, the blade is not subjected to wear and tear resulting from the frictions generated at the pivot level; the largest occurring stress amplitude to which the blade is subjected remains below its fatigue strength during normal operating conditions and even when the rotary unit goes into an error mode and exceeds the angle of a predefined rotation; and contrary to conventional stoppers with hard-stop, the magnetically interaction between the mobile magnet and the rotary arm magnet avoids any contact which is a cause of wear and tear.

Although, the magnetic stopper is particularly adapted for a high-precision position system, for cleanroom environment applications, including an X-Y motion system and the rotary motion system mounted thereon, the magnetic stopper may be used for any other application where a rotary unit is rotatably mounted on a based unit.

In addition, while the mobile magnet of the static part is connected to a blade via a magnet holder as described above, any other arrangement for guiding the mobile magnet without friction or reduced friction may be implemented within the spirit and scope hereof. For example, the mobile magnet may be mounted on a distal end portion of the rotary arm while a proximal part of the rotary arm is mounted around a pivot via a ceramic bearing which has significant lower friction properties than conventional stainless-steel bearings.

LIST OF REFERENCE NUMERALS

Rotary motion system 100
Base unit 102
Mounting base portion 103
Rotary Unit 104
Rotary wafer holding unit
Magnetic stopper 10
Static part 12
Casing 13
Lateral sides 13a, 13b
Rotary arm stopping portion 14
Inclined opposite sides 18a, 18b
Static magnets 22a, 22b (one embodiment)
Movable arrangement
Mobile magnet support
Blade 24
Proximal end portion 24a
Distal end portion 24b
Blade connecting means 25
Clamping arrangement
Magnet holder 26
First magnet holder fixing part 26a
Second magnet holder fixing part 26b
Mobile magnet 28
Rotary arm 30
Proximal end portion 32a
Distal end portion 32b
Magnet receiving portion 34
Rotary arm magnet 36

The invention claimed is:

1. A magnetic stopper for a rotary motion system that includes a base unit and a rotary unit rotatably mounted on the base unit, comprising:

a static part adapted to be mounted on the base unit and including:
  a rotary arm stopping portion; and
  a movable arrangement including a magnet holder and a mobile magnet mounted on the magnet holder and movable within the rotary arm stopping portion; and
a rotary arm adapted to be mounted on the rotary unit and including a distal end portion, the rotary arm stopping portion adapted to receive the distal end portion, the rotary arm including a rotary arm magnet adapted to magnetically interact with the mobile magnet in a mounted state of the static part on the base unit and in a mounted state of the rotary arm on the rotary unit to prevent excessive movement of the rotary unit during operation of the rotary motion system;
wherein a same pole of the mobile magnet and the rotary arm magnet face each other during movement of the rotary arm within the rotary arm stopping portion to repel each other without contact.

2. The magnetic stopper according to claim 1, wherein the magnet holder is adapted to hold the mobile magnet to align poles of the mobile magnet with a tangent of a circular trajectory of the rotary arm magnet during movement of the rotary arm within the rotary arm stopping portion of the static part.

3. The magnetic stopper according to claim 1, wherein a circular trajectory of the rotary arm magnet within the rotary arm stopping portion is between 10° and 20°.

4. The magnetic stopper according to claim 1, wherein the rotary arm magnet is mounted in a magnet receiving portion of the distal end portion of the rotary arm with opposite poles aligned with a tangent of a circular trajectory of the rotary arm magnet corresponding to a rotation of the rotary unit relative to the base unit.

5. The magnetic stopper according to claim 1, wherein the movable arrangement includes a blade having a proximal end portion connected to the static part and a distal end portion connected to the magnet holder; and
  wherein the blade is adapted to bend during magnetic interaction between the rotary arm magnet and the mobile magnet.

6. The magnetic stopper according to claim 5, wherein the static part includes a casing, the blade being arranged inside the casing along an axis equidistant from lateral sides of the casing in a non-operating configuration of the blade.

7. The magnetic stopper according to claim 6, wherein the rotary arm stopping portion includes two opposite sides inclined with respect to the axis, the magnet holder adapted to contact one of the opposite sides in response to the rotary unit entering an error mode and exceeding a predefined rotation.

8. The magnetic stopper according to claim 6, wherein the static part includes static magnets adapted to prevent the magnet holder from contacting either of two opposite sides of the rotary arm stopping portion in response to the rotary unit entering an error mode and exceeding a predefined rotation.

9. The magnetic stopper according to claim 1, wherein the mobile magnet has a cuboid shape and the rotary arm magnet has a cylindrical shape.

10. A rotary motion system, comprising:
  a base unit;
  a rotary unit rotatably mounted on the base unit;
  a magnetic stopper including:
    a static part mounted on the base unit and including:
      a rotary arm stopping portion; and
      a movable arrangement including a magnet holder and a mobile magnet mounted on the magnet holder and movable within the rotary arm stopping portion; and
    a rotary arm mounted on the rotary unit and including a distal end portion, the rotary arm stopping portion adapted to receive the distal end portion, the rotary arm including a rotary arm magnet adapted to magnetically interact with the mobile magnet in a mounted state of the static part on the base unit and in a mounted state of the rotary arm on the rotary unit to prevent excessive movement of the rotary unit during operation of the rotary motion system;
  wherein a same pole of the mobile magnet and the rotary arm magnet face each other during movement of the rotary arm within the rotary arm stopping portion to repel each other without contact.

11. The rotary motion system according to claim 10, wherein the rotary arm is mounted on a lateral side portion of the rotary unit and extends radially outwardly from an outer edge of the lateral side portion.

12. The rotary motion system according to claim 10, wherein the magnet holder holds the mobile magnet to align poles of the mobile magnet with a tangent of a circular trajectory of the rotary arm magnet during movement of the rotary arm within the rotary arm stopping portion of the static part.

13. The rotary motion system according to claim 10, wherein a circular trajectory of the rotary arm magnet within the rotary arm stopping portion is between 10° and 20°.

14. The rotary motion system according to claim 10, wherein the rotary arm magnet is mounted in a magnet receiving portion of the distal end portion of the rotary arm with opposite poles aligned with a tangent of a circular trajectory of the rotary arm magnet corresponding to a rotation of the rotary unit relative to the base unit.

15. The rotary motion system according to claim 10, wherein the movable arrangement includes a blade having a proximal end portion connected to the static part and a distal end portion connected to the magnet holder; and
  wherein the blade is adapted to bend during magnetic interaction between the rotary arm magnet and the mobile magnet.

16. The rotary motion system according to claim 15, wherein the static part includes a casing, the blade being arranged inside the casing along an axis equidistant from lateral sides of the casing in a non-operating configuration of the blade.

17. The rotary motion system according to claim 16, wherein the rotary arm stopping portion includes two opposite sides inclined with respect to the axis, the magnet holder adapted to contact one of the opposite sides in response to the rotary unit entering an error mode and exceeding a predefined rotation.

18. The rotary motion system according to claim 16, wherein the static part includes static magnets adapted to prevent the magnet holder from contacting either of two opposite sides of the rotary arm stopping portion in response to the rotary unit entering an error mode and exceeding a predefined rotation.

19. The rotary motion system according to claim 10, wherein the mobile magnet has a cuboid shape and the rotary arm magnet has a cylindrical shape.

20. A high-precision positioning system, comprising:
  an X-Y motion system; and
  a rotary motion system mounted on the X-Y motion system and including:

a base unit;

a rotary unit rotatably mounted on the base unit;

a magnetic stopper including:
- a static part mounted on the base unit and including:
  - a rotary arm stopping portion; and
  - a movable arrangement including a magnet holder and a mobile magnet mounted on the magnet holder and movable within the rotary arm stopping portion; and
- a rotary arm mounted on the rotary unit and including a distal end portion, the rotary arm stopping portion adapted to receive the distal end portion, the rotary arm including a rotary arm magnet adapted to magnetically interact with the mobile magnet in a mounted state of the static part on the base unit and in a mounted state of the rotary arm on the rotary unit to prevent excessive movement of the rotary unit during operation of the rotary motion system.

21. The magnetic stopper according to claim 1, wherein a circular trajectory of the rotary arm magnet within the rotary arm stopping portion is between 10° and 15°.

22. The rotary motion system according to claim 10, wherein a circular trajectory of the rotary arm magnet within the rotary arm stopping portion is between 10° and 15°.

\* \* \* \* \*